US007981723B2

(12) United States Patent
Yang et al.

(10) Patent No.: US 7,981,723 B2
(45) Date of Patent: Jul. 19, 2011

(54) CAPPED WAFER METHOD AND APPARATUS

(75) Inventors: Xue'en Yang, Pasadena, CA (US); Milind Bhagavat, Medford, MA (US); Erik Tarvin, South Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 245 days.

(21) Appl. No.: 12/268,605

(22) Filed: Nov. 11, 2008

(65) Prior Publication Data

US 2010/0117221 A1 May 13, 2010

(51) Int. Cl.

| | |
|---|---|
| ***H01L 21/44*** | (2006.01) |
| ***H01L 21/48*** | (2006.01) |
| ***H01L 21/50*** | (2006.01) |

(52) U.S. Cl. ................. 438/106; 438/460; 257/E21.499

(58) Field of Classification Search .................... 438/68, 438/106, 121, 125, 460, 462; 257/E21.499
See application file for complete search history.

(56) References Cited

U.S. PATENT DOCUMENTS

| | | | | |
|---|---|---|---|---|
| 6,483,160 | B2 | 11/2002 | Engelhardt et al. | 257/415 |
| 6,893,574 | B2 | 5/2005 | Felton et al. | 216/2 |
| 6,946,366 | B2 * | 9/2005 | Spooner et al. | 438/460 |
| 2003/0075794 | A1 | 4/2003 | Felton et al. | 257/707 |

* cited by examiner

*Primary Examiner* — Hoai v Pham
(74) *Attorney, Agent, or Firm* — Sunstein Kann Murphy & Timbers LLP

(57) ABSTRACT

A capped wafer includes a device wafer and an opposing cap wafer with an annular glass frit disposed between the device wafer and the cap wafer. The glass frit and the opposing wafers define a sealed volume that encloses the capped devices, and the glass frit may support the wafer cap during removal of excess wafer cap material from the capped wafer. A method of fabricating a capped wafer includes fabricating an annular intermediate layer between a device wafer and a cap wafer. In an alternate embodiment, a plurality of unsingulated dice each contains bond pads along a single edge and are arranged on a device wafer in an alternating order so that the bond pads of a first die are adjacent to the bond pads of a second die. Removing excess cap wafer material involves making a first cut in the cap wafer near a first row of bond pads and a second cut near the adjacent row of bond pads, such that a strip of wafer cap material is suspended from portions of an underlying supporting member near the edge of the capped wafer, and then removing the wafer cap material suspended from the portions of the supporting glass frit using an adhesive tape.

9 Claims, 12 Drawing Sheets

CAPPED WAFER METHOD AND APPARATUS

TECHNICAL FIELD

The present invention relates to semiconductor wafer capping, and more particularly, to methods and apparatuses for more efficiently fabricating capped semiconductor wafers.

BACKGROUND ART

Individual die on a device wafer may be individually capped by mounting an opposing cap wafer to the device wafer. Accordingly, each device on the device wafer mates to an opposing cap on the cap wafer. FIG. 1A schematically illustrates a device wafer 100 with a plurality of dice (individually, a "die" 105) arranged in rows 102R and columns 102C. Between the rows and columns of mesas are gaps, which may be known as "saw streets" 106.

FIG. 2A shows a corresponding cap wafer with caps 203 arranged in corresponding rows 202. Each cap 203 may be formed by etching a cavity 207 (see FIG. 2B) into the surface of the cap wafer 200, and by etching trenches (not shown) between the cavities 207, so that mesas 204 are formed. Each such mesa 204 has a top surface 205 that is what remains of the original surface of the cap wafer 200 surrounding the cavity 203. The dashed lines in FIG. 2A and FIG. 2B illustrate the outline of a corresponding die 105 on an opposing device wafer 100, and do not illustrate physical features of the cap wafer 200.

An intermediate layer, such as a glass frit 206, is formed between the die 105 and cap 203 to seal components of each die 105 within its cap 203 when the cap wafer 200 is mated to the device wafer 100, as illustrated in FIG. 3A.

In some applications, a part of a die 105 (such as a MEMS structure 104 shown in FIG. 1B and in FIG. 3A, for example) is within a volume 208 defined by a mesa 204 on the cap wafer 200 and the cap wafer 200 (e.g., the cavity 207), the device wafer 100, and intermediate layer 206, while other parts of the die (such as integrated circuitry and bond pads, for example) are outside of that volume in an area illustrated in FIG. 1B as hatched area 103.

Post processing, such as wafer thinning or removal of excess wafer cap material for example, may be performed on a capped wafer before the dice 105 are singulated. To protect the circuit elements 103 that are not enclosed within a cap 203, wax (not shown) is typically deposited between the device wafer 100 and the cap wafer 200, around and between the caps 203. However, the wax may be difficult to remove.

Prior to cutting the wafer into individual die (a process which may be known as "singulation," or "singulating" the wafer), portions of the cap wafer 200 that are not covering a die (or a desired portion of a die) may be removed. Removal of such excess portions of the wafer cap 200 is often done by sawing the cap wafer 200 above the saw streets, as illustrated in FIG. 3B. In such a process, the saw blade 210 is set deep enough to cut through the cap wafer 200, but shallow enough to avoid contact with the device wafer 100. When the dice 105 are in a grid pattern, the excess wafer cap material may also be in a grid, and therefore be difficult to remove.

After the excess cap material and wax are removed, the dice are singulated by cutting through the device wafer along the saw streets

SUMMARY OF THE INVENTION

A first embodiment of the invention has a device wafer and an opposing cap wafer. The device wafer and the cap wafer are coupled together by an intermediate layer (for example, an intervening glass frit) that provides a seal between the die on the device wafer and the mesas of the cap wafer, and also forms an annular structure or wall between the device wafer and the cap wafer near their respective perimeters. The annular intermediate layer defines a cylindrical volume between the device wafer and the cap wafer, and seals the volume to protect the devices of the device wafer during post processing. The intermediate layer also supports strips of excess wafer cap material during removal of such material.

In another embodiment of the invention, the intermediate layer is a non-continuous (e.g., a broken) annular wall, that provides support for supports strips of excess wafer cap material during removal of such material.

In another embodiment of the invention, excess wafer cap material is removed by cutting the cap wafer into strips, which strips are supported above the device wafer at their distal ends by the annular intermediate layer. Arranging the individual dice on the device wafer with all bond pads or other element on one edge of the die and aligned with neighboring dice may facilitate the wafer capping process.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Figure 4A:
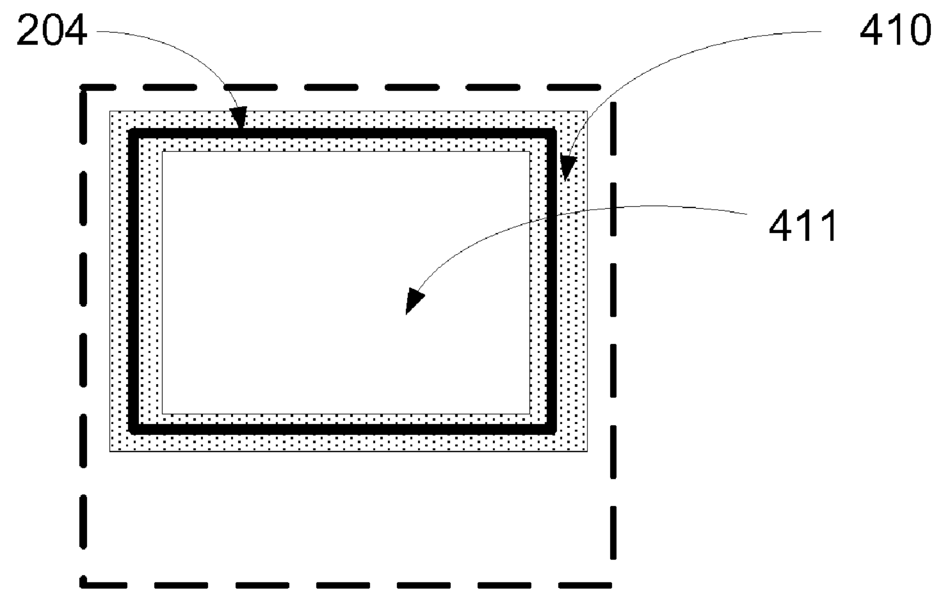
FIG. 4A schematically illustrates an alternate cap structure.
Figure 4B:
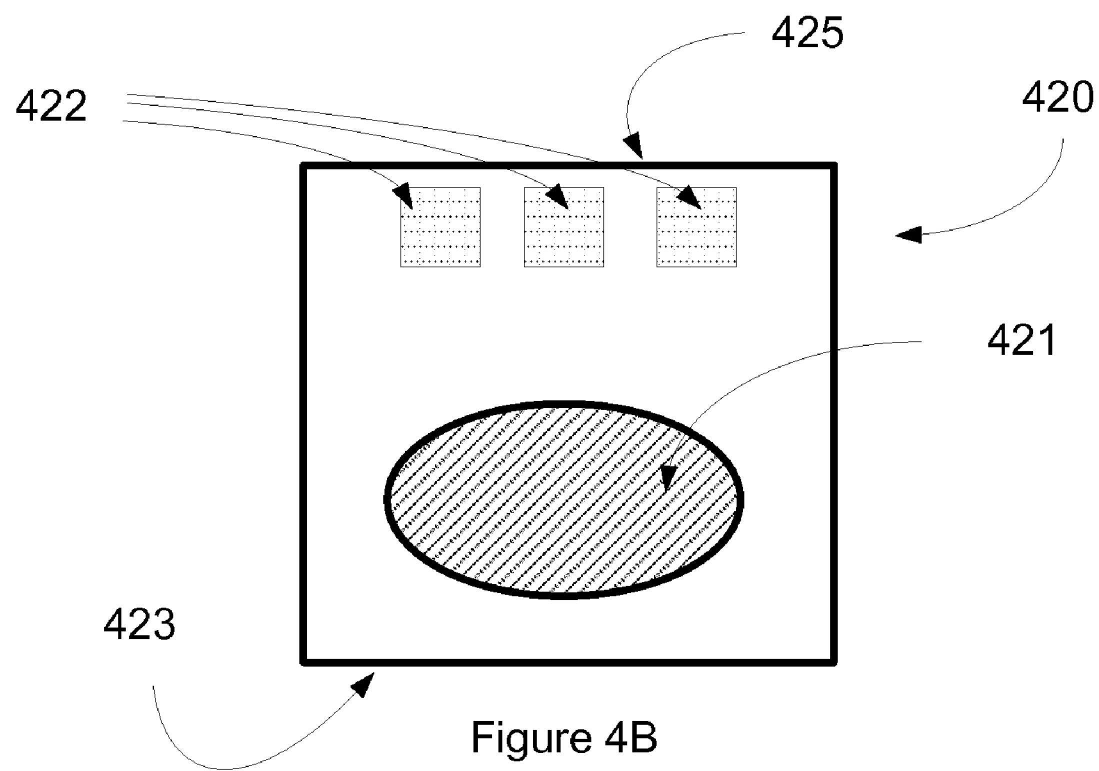
FIG. 4B schematically illustrates a MEMS die.

Some MEMS device die contain a MEMS device in a first area of the die, and bond pads in a second area of the die. In a rectangular MEMS die 420, as illustrated in FIG. 4B, the MEMS device 421 may be adjacent to a first end of the die, and bond pads 422 may be adjacent to the opposite end of the die. A corresponding mesa 410 (FIG. 4A) on a cap wafer (not shown) may be formed to surround the MEMS device 421 and enclose the MEMS device 421 within an etched cavity 411.

Figure 4C:
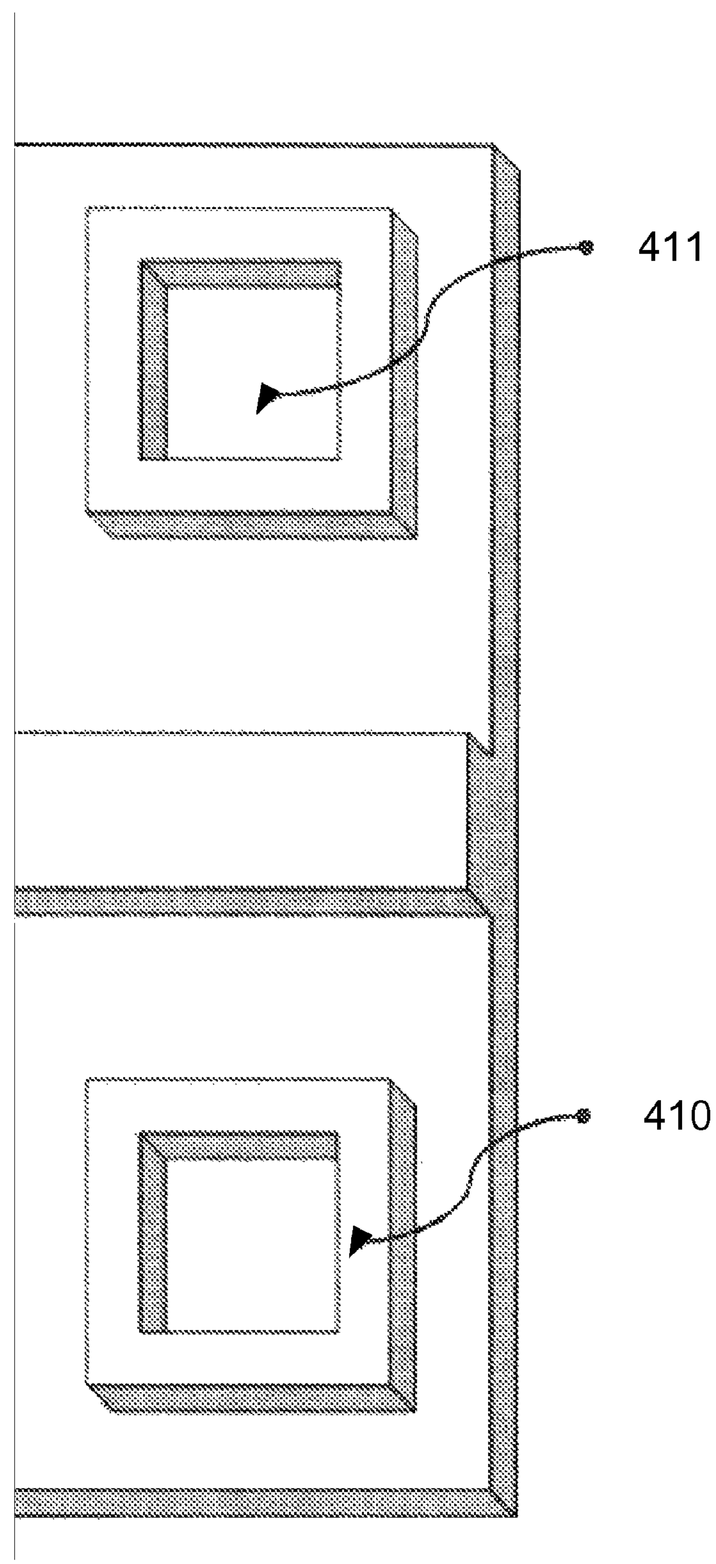
FIG. 4C schematically illustrates a perspective view of two mesas, each with a cavity.
Figure 4D:
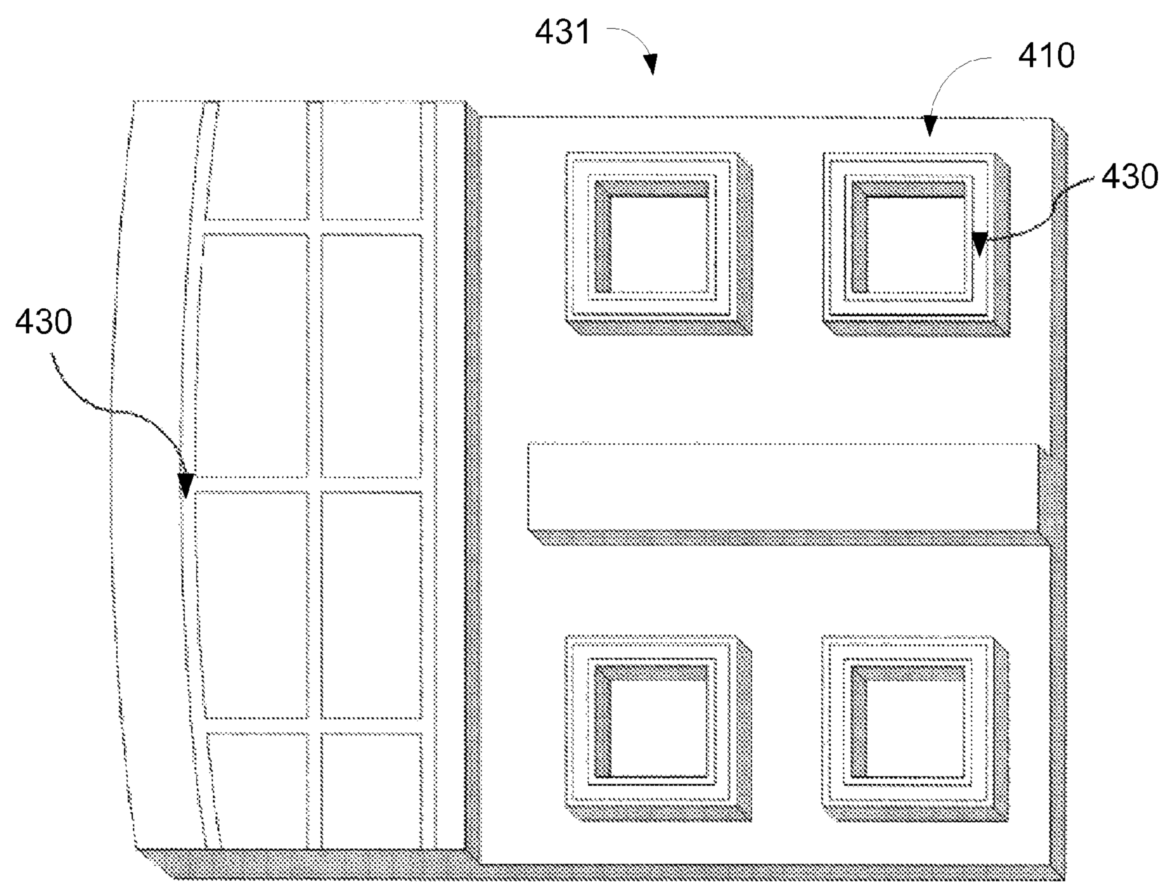
FIG. 4D schematically illustrates a perspective view of a wafer with a glass frit patterned near the edge.

A perspective view of a mesa 410 and a cavity 411 is presented in FIG. 4C. A glass frit 430 on a mesa 410 and along the edge of a cap wafer 431 is illustrated in FIG. 4D.

In some embodiments, the mesa 410 may include an intermediate layer (such as a glass bead) 204 to seal the mesa to the surface of a device wafer. For example, a glass bead may be formed as part of a glass frit on the surface of the cap wafer or the device wafer.

Individual die in this configuration may be arranged on a device wafer in a space-efficient manner, which may allow more die to be fabricated on a given wafer, and may also facilitate removal of excess cap material. In some embodiments, as illustrated on wafer 520 in FIG. 5B, the dice 420 may be arranged in rows in the x-axis (such as rows 523 and 524, for example), in which the bond pads 422 of the dice 420 in a first row 523 are immediately adjacent to the bond pads 422 of the dice 420 in an adjacent row 524. Similarly, the MEMS devices 421 of the dice 420 in the row 524 are arranged to be immediately adjacent to the MEMS devices 421 of the dice 420 in a third row 525. In this illustrative embodiment, it can be seen that the individual dice do not share a common orientation, because the dice in one row are rotated 180 degrees (in the plane of the wafer) from the dice in each adjacent row. Die 420 will be used as an example herein, but is not intended be limit the scope or application of the present invention. Also, figures herein are not necessarily drawn to scale.

In this illustrative embodiment, it can be seen that the space between the devices 421 are wide enough to accommodate two rows of bond pads 531 and 532 in an avenue 530. A first row of bond pads 531 is formed on one side of the saw street by the bond pads of the dice 420 in a first row, and a second row of bond pads 532 is formed on the other side of the saw street by the bond pads of the dice 420 in an adjacent row. Because there are no bond pads or other devices along a line parallel to the y-axis that need to be exposed, it can also be seen that removal of excess wafer cap material (in a capped wafer above avenue 530) will entail the removal of strips of wafer cap material only in the x-axis. In these figures, the x-axis and y-axis are included for reference only, and do not limit the scope of the present invention.

Figure 5A:
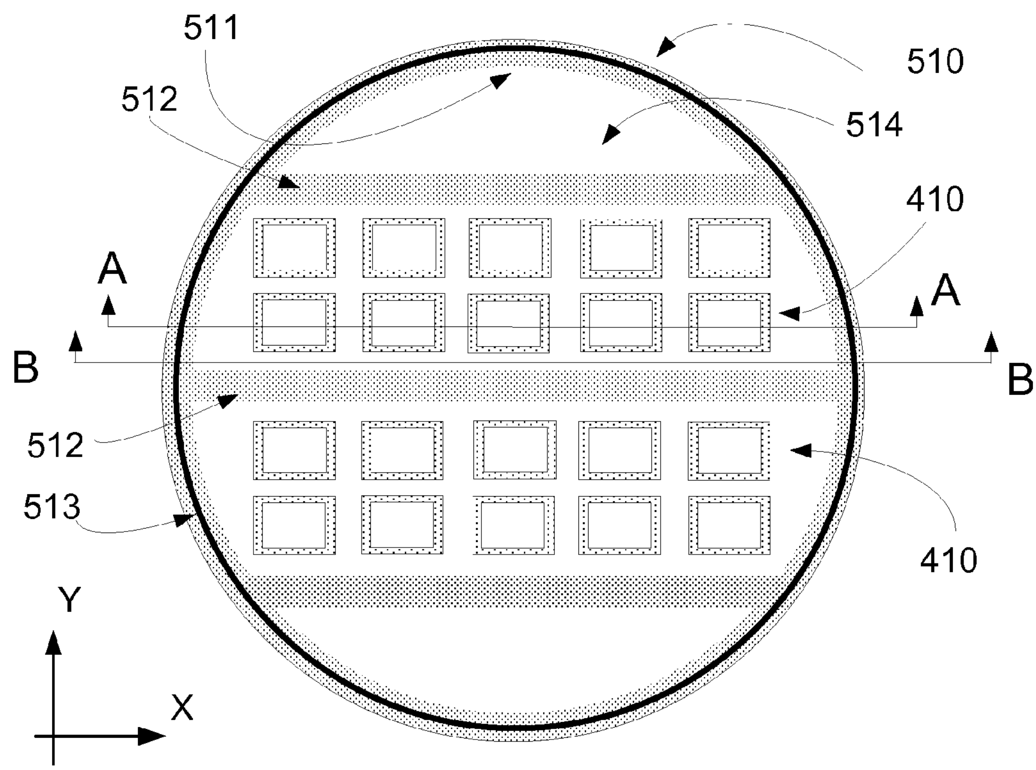
FIG. 5A schematically illustrates another cap wafer.
Figure 5B:
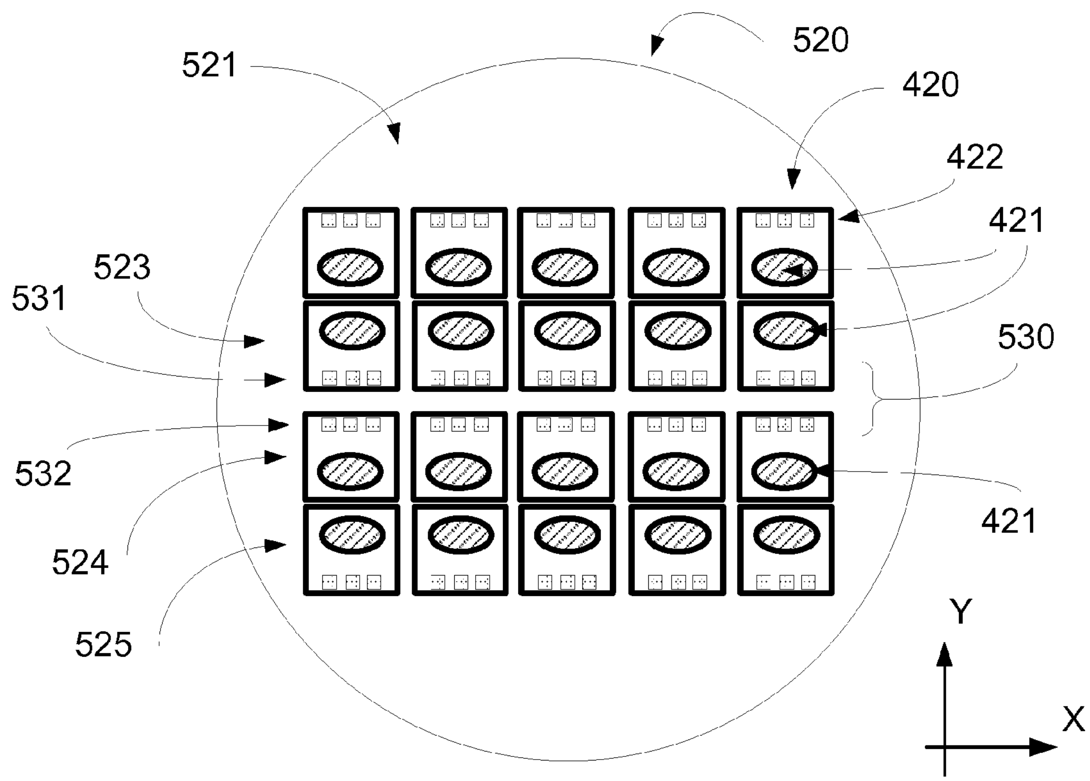
FIG. 5B schematically illustrates another device wafer.

A cap wafer 510 in some illustrative embodiments is schematically illustrated in FIG. 5A. The cap wafer 510 has two faces—a cap face 514 (shown) and a back face (reverse)— and includes a plurality of mesas 410 on the cap face 514 arranged in a pattern corresponding to the devices on a device wafer. The mesas 410 may be formed by etching a cavity 411 in the cap face within the each mesa 410, and etching a trench in the cap face between mesas. In preferred embodiments, the etching does not form a hole in all the way through the cap wafer 510.

In some embodiments, the cap wafer 510 includes a wall 511 at its outer edge. The wall 511 may be formed by etching the cap face 514 of the cap wafer 510 near the edge, resulting in the definition of the wall 511 in an annular shape. The top surface of the wall 511 is what remains of the original surface of the cap wafer 510 near the edge of the cap wafer 510. The wall 511 may include an intermediate layer 513 (such as a glass bead) on the surface of the wall 511 to attach the cap wafer 510 to device wafer 520 along the wall 511.

In some embodiments, the cap wafer 510 may also include one or more ridges 512 that correspond to the saw streets on the device wafer 520. In preferred embodiments, the ridges 512 do not include a glass bead and do not seal to the face of the device wafer 520. Such ridges may be formed by etching the cap face of the cap wafer.

Figure 1A:
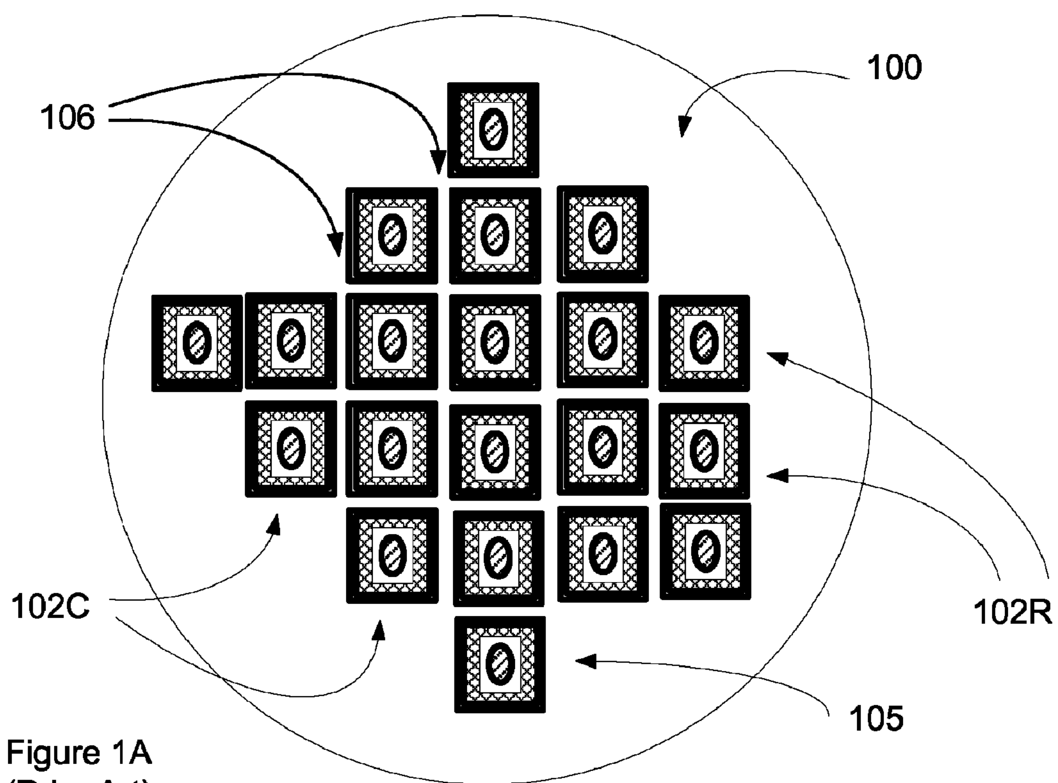
FIG. 1A schematically illustrates a device wafer, with a plurality of devices (individual die) arranged in columns and rows.
Figure 1B:
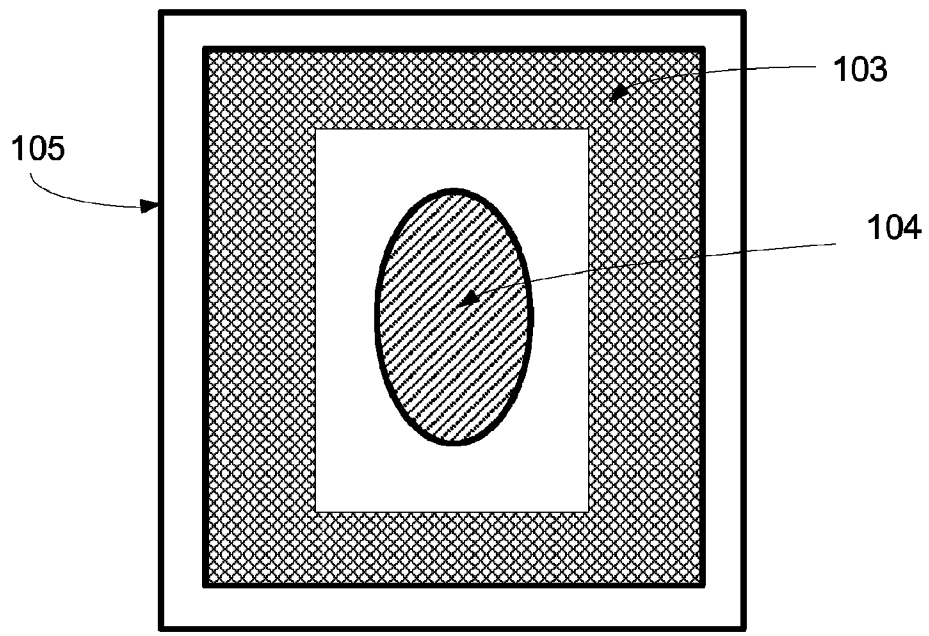
FIG. 1B schematically illustrates a MEMS die.
Figure 2A:
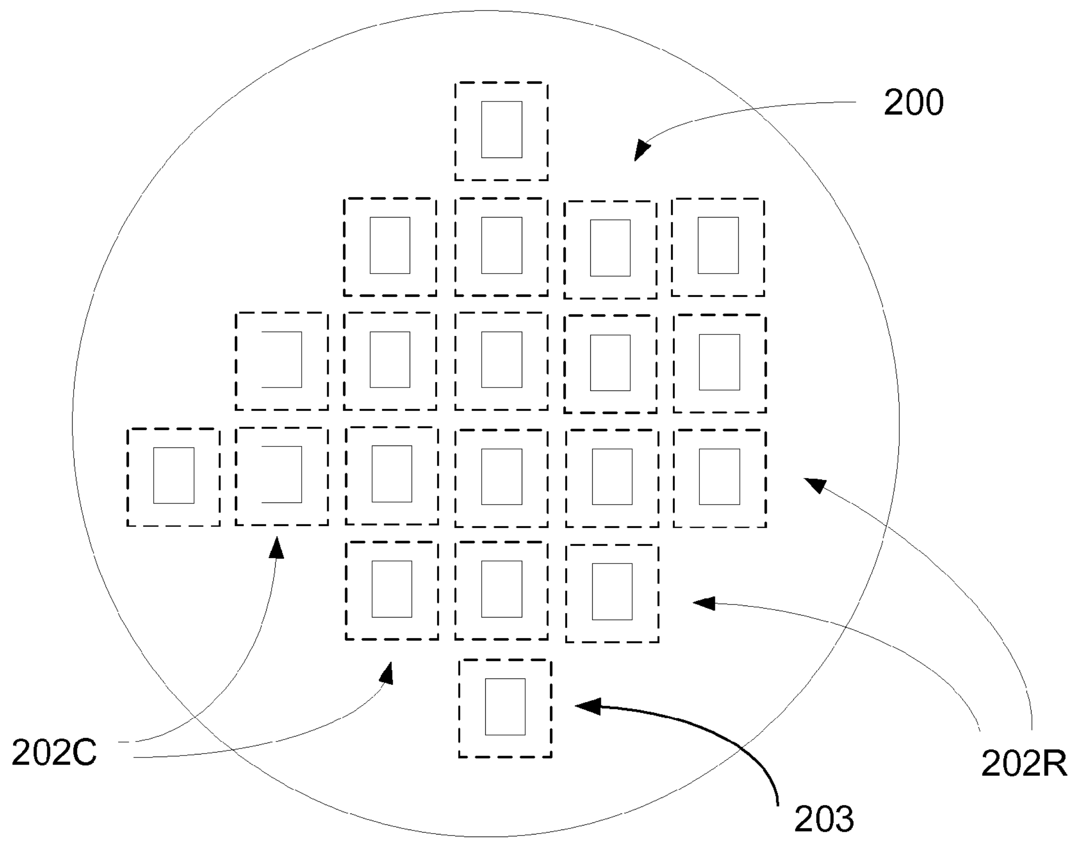
FIG. 2A schematically illustrates a cap wafer, with a plurality of caps arranged in columns and rows.
Figure 2B:
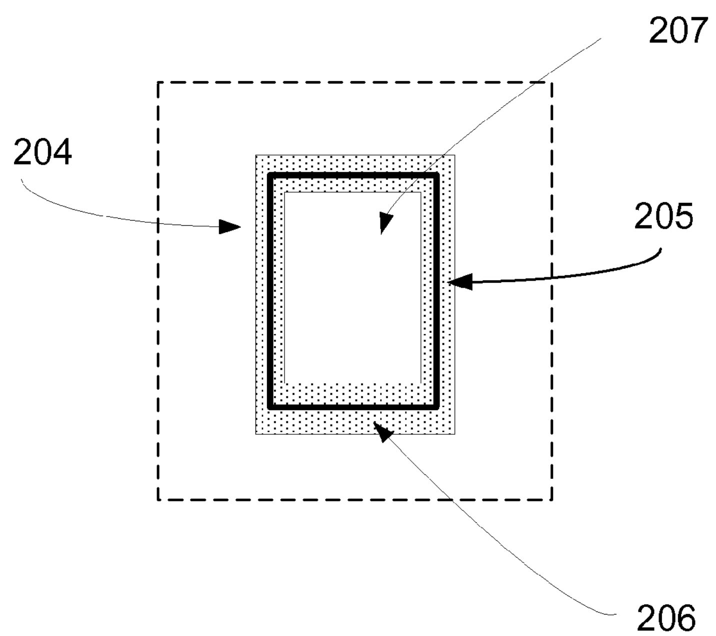
FIG. 2B schematically illustrates a cap on the cap wafer of FIG. 2A.
Figure 3A:
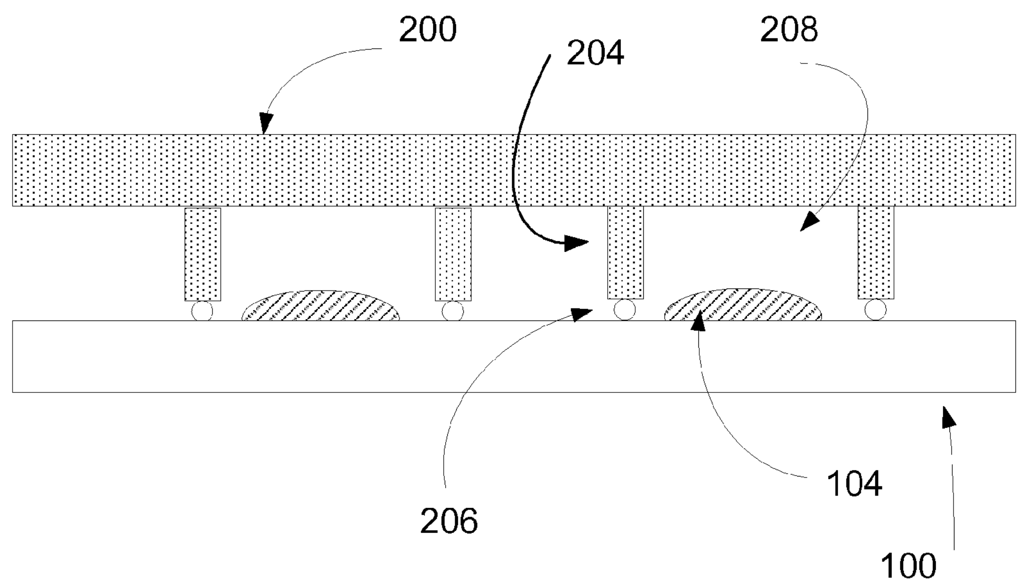
FIG. 3A schematically illustrates a cross-section of a capped wafer.
Figure 3B:
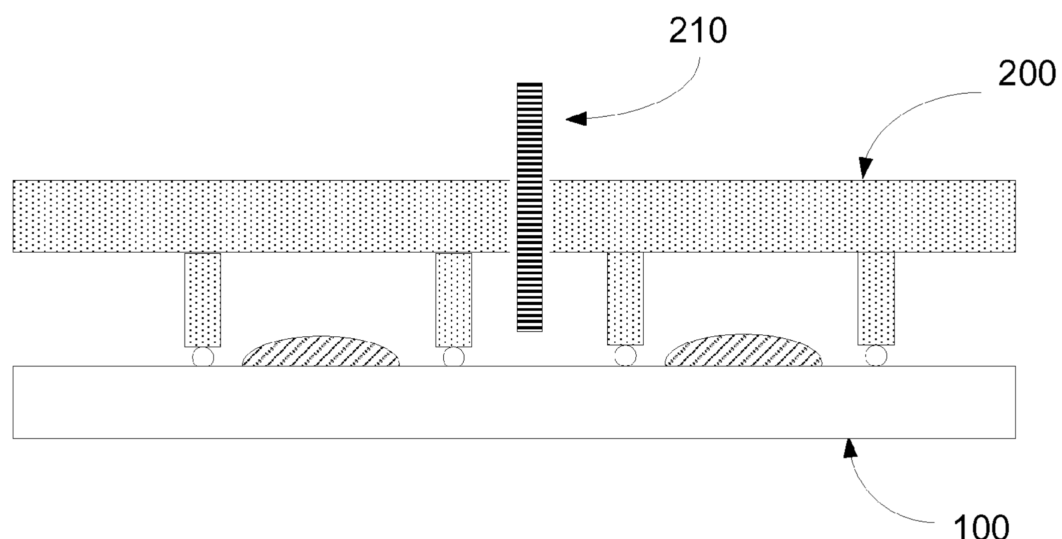
FIG. 3B schematically illustrates the sawing of a cap wafer.

In some embodiments, the device wafer 520 may be mated to the cap wafer 510 so that the mesas 410 surround the MEMS devices 421 of the dice 420 on the device wafer 520. As such, a portion of each die 420 is enclosed in a volume defined by the cap wafer 510, the device wafer 520, the mesas 410, and the intermediate layer 204 that lies between the top surface of the mesas 410 and the surface of the device wafer 520 (similar to the illustration in FIG. 3A).

In some embodiments, the device wafer 520 may be mated to the cap wafer 510 via the wall 511 and intermediate layer 513. The cap wafer 510 (including the wall 511), the device wafer 520, and the intermediate layer 513 may define a volume. Portions of the individual dice are enclosed (and maybe sealed) within the volume.

In some embodiments, the intermediate layer 513 between the surface of the wall 511 and the face of the device wafer 520 may form a seal between the top surface of the wall 511 and the surface of the device wafer 520. This seal protects the dice, including the bond pads that are outside of the mesas 421, from etchants or other materials that may be used in post-processing of the wafer, and therefore obviate the need for a wax filler. The seal may be impermeable to a specific fluid (liquid or gas) for certain durations, depending on the requirements resulting from subsequent manufacturing processes, but in general need not be hermetic, or impermeable to all fluids, or be impermeable for an indefinite period. The quality and durability of any such seal will be dictated by the needs of the process.

It should be noted that the wall 511 is not limited to a circular shape, and need not be perfectly annular. In some embodiments, the wall 511 follows a path (circular or otherwise) to surround two or more dice on the device wafer. Also, the wall 511 does not need to be immediately adjacent to the edge of a wafer. In some embodiments, according to the deign and layout of the wafer, the wall 511 may be inward from the edge, or near the edge at some points and inward from the edge at other points. The term "annular" will be used herein to denote a shape that meets at least one of these descriptions or purposes.

When the cap wafer 510 is mated to the device wafer 520, in illustrative embodiments, they form a capped wafer 600. In a preferred embodiment, the cap wafer 510 will substantially completely cover the device wafer 520, including the area above each avenue 530.

Figure 6A:
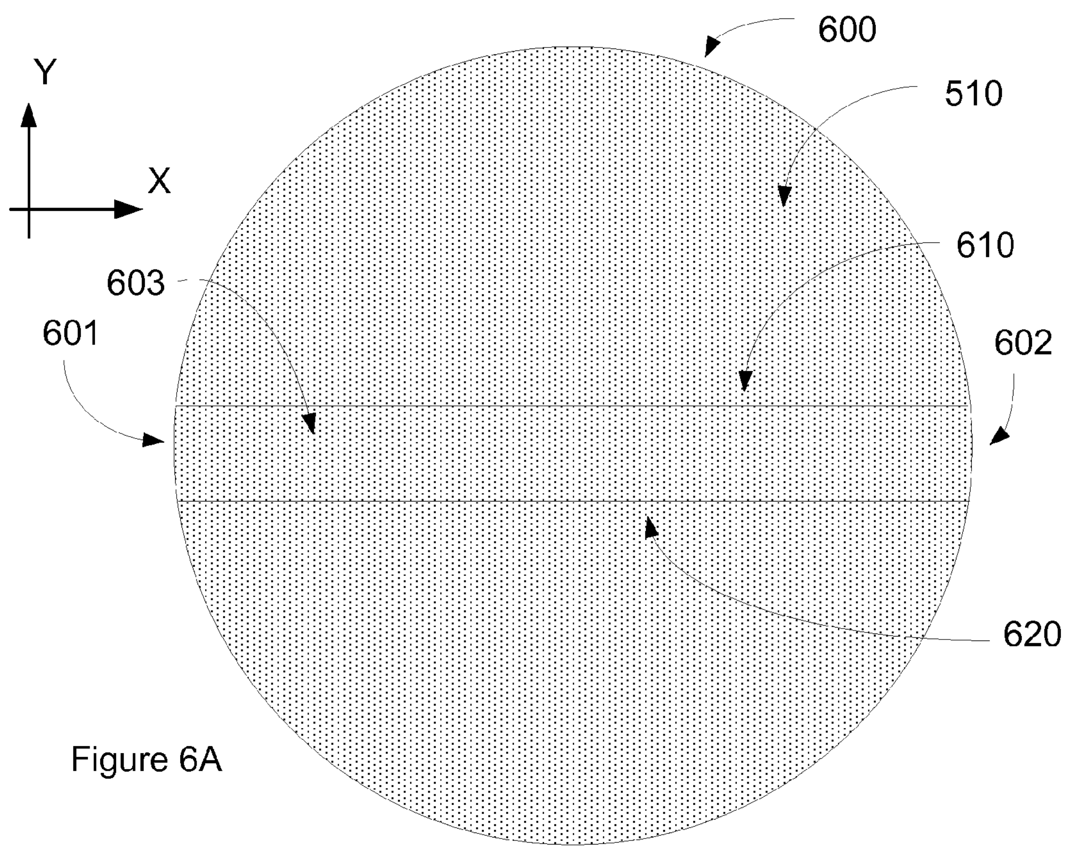
FIG. 6A schematically illustrates a capped wafer in which initial perforations have been made in the cap wafer.

In the illustrative capped wafer 600 of FIG. 6A, the cap wafer 510 completely covers the device wafer 520, so that in this illustration only the backside of the cap wafer 510 is visible (the cap face of the cap wafer 510 is the reverse of the visible back face of the cap wafer 510, and is therefore not visible in FIG. 6A).

In some embodiments, the cap wafer 510 will be supported from the device wafer 520 by the various mesas 410, the intermediate layer 513, and the wall 511.

Portions of the cap wafer 510 above a avenue 530 may be removed by sawing, or otherwise creating, perforations through the cap wafer 510 along both sides of the avenue 530. In a preferred embodiment, each such perforation is made with a saw that is set deep enough to cut through the wafer cap, but shallow enough to avoid contacting the device wafer. A second perforation 620 may be made substantially parallel to the first perforation, on the other side of the avenue 530 (as illustrated, for example, in FIG. 6A).

If the first perforation 610 and the second perforation 620 extend from one edge 601 of the cap wafer 510 to the opposing edge 602 of the cap wafer, then a strip of cap wafer 603 is defined, and has an axis parallel to the first and second perforations. In a preferred embodiment, the strip of cap wafer 603 will be substantially above the avenue 530. Further, this strip of cap wafer 603 will be supported at its opposing ends by sections of the wall 511. If the cap wafer includes a ridge 512 along the saw street, then the ridge may also lend support to the strip of cap wafer 603.

However, because the wall 511 is secured to the device wafer 520 by the intermediate layer 513, the strip of cap wafer 603 is secured to the device wafer 520 by the respective segments of the wall 511 and intermediate layer 513. Each such segment of the wall 511 may therefore be described as a type of supporting member that supports the strip of cap wafer 603, as further illustrated in FIG. 7A.

Figure 7A:
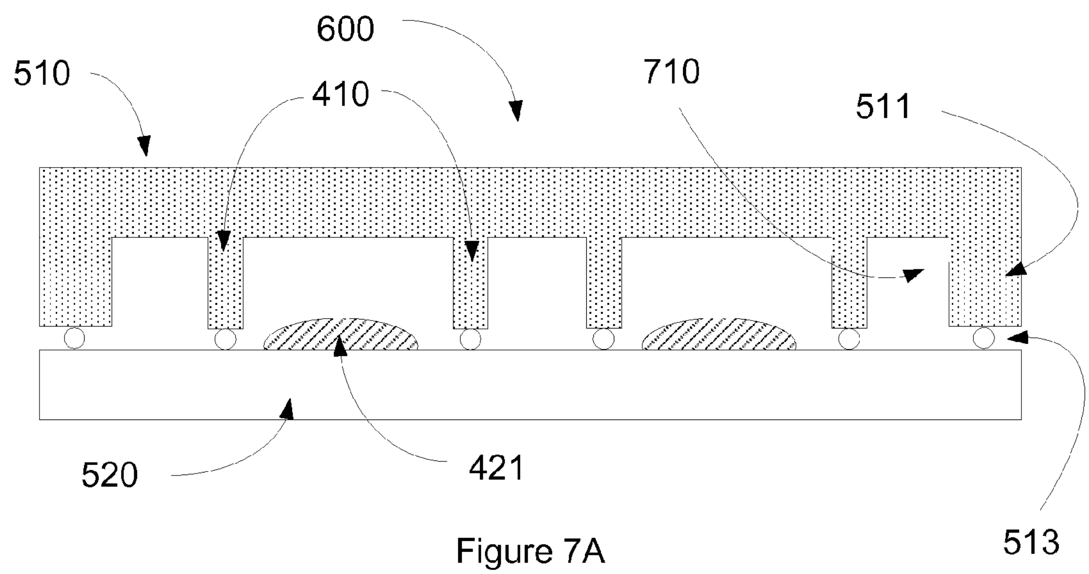
FIG. 7A is a cross-section of a capped wafer, along a row of capped devices.

FIG. 7A is a cross section of a capped wafer along line A-A in FIG. 5A, and shows devices 421 enclosed by mesas 410. The wall 511 and intermediate layer 513 form an illustrative supporting member 710 near one edge of the capped wafer 600.

Figure 7B:
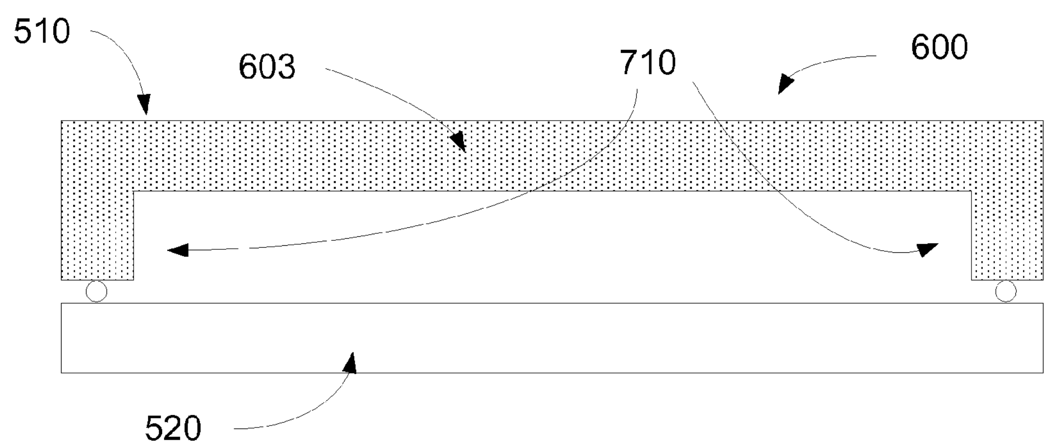
FIG. 7B is a cross-section of a capped wafer, along a saw street.

FIG. 7B is a cross section of a capped wafer along line B-B in FIG. 5A (i.e., along a portion of the avenue 530). A portion of the cap wafer 510 has been perforated as in FIG. 6A, to form the strip of cap wafer 603. The strip of cap wafer 603 is supported at its distal ends by two supporting members 710.

Figure 6B:
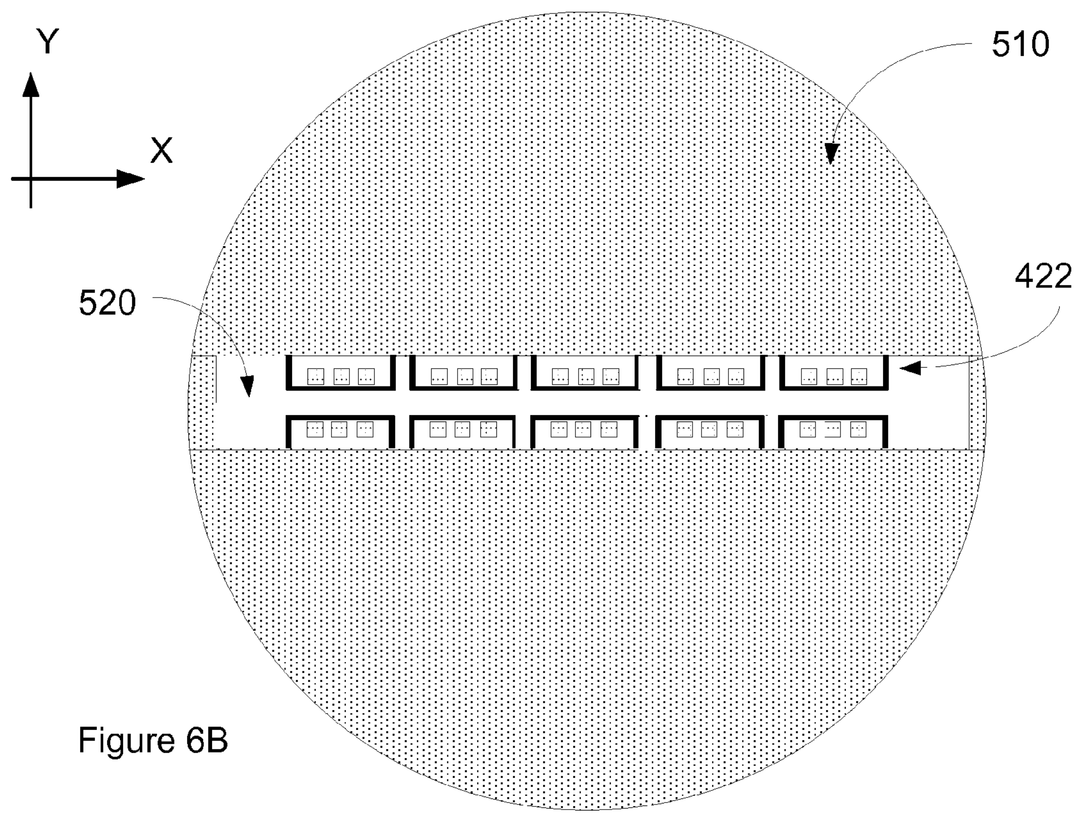
FIG. 6B schematically illustrates the capped wafer of FIG. 6A in which a strip of the cap wafer has been removed.
Figure 7C:
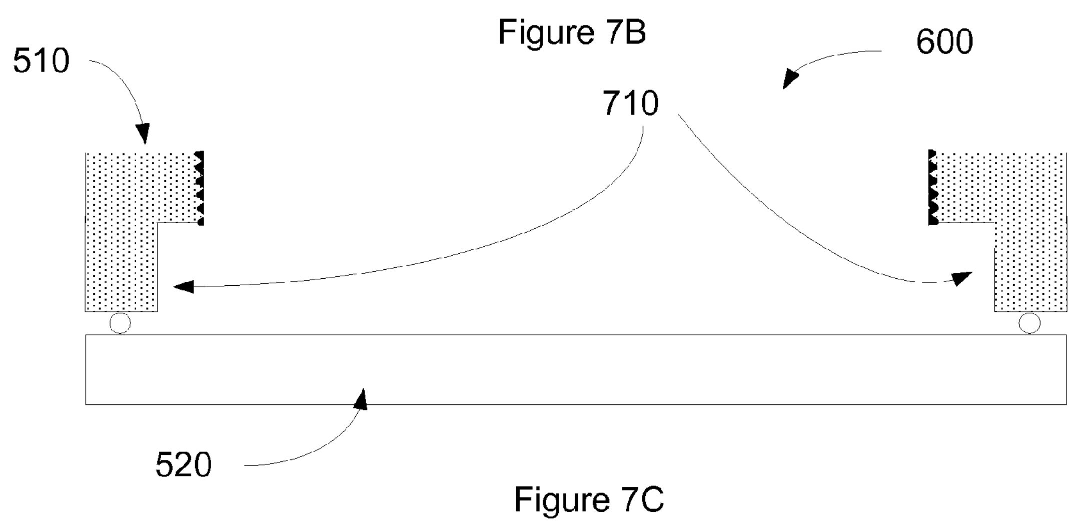
FIG. 7C a cross-section of the capped wafer of FIG. 7B, in which the excess cap wafer material over the saw street has been removed.

To complete the removal of the strip of cap wafer 603, an adhesive tape as known in the art (not shown) may be attached to the strip of cap wafer 603 from the back face of cap wafer 510, and then pulled away from the capped wafer so as to pull the strip of cap wafer along with it. The supporting members 710 may initially resist allowing the strip of cap wafer 603 to be separated from the capped wafer 600, but sufficient force will sever the strip of cap wafer 603 from the supporting members 710, as illustrated in FIG. 7C. Ultimately, the strip of cap wafer 603, which will include an underlying ridge 512 if present, is removed to expose a portion of the underlying device wafer 520, including the bond pads 422, as illustrated in FIG. 6B. In a preferred embodiment, all such strips of cap wafer are formed prior to removing a first strip of cap wafer, and then all such strips of cap wafer are removed in a single application of adhesive tape.

Figure 8:
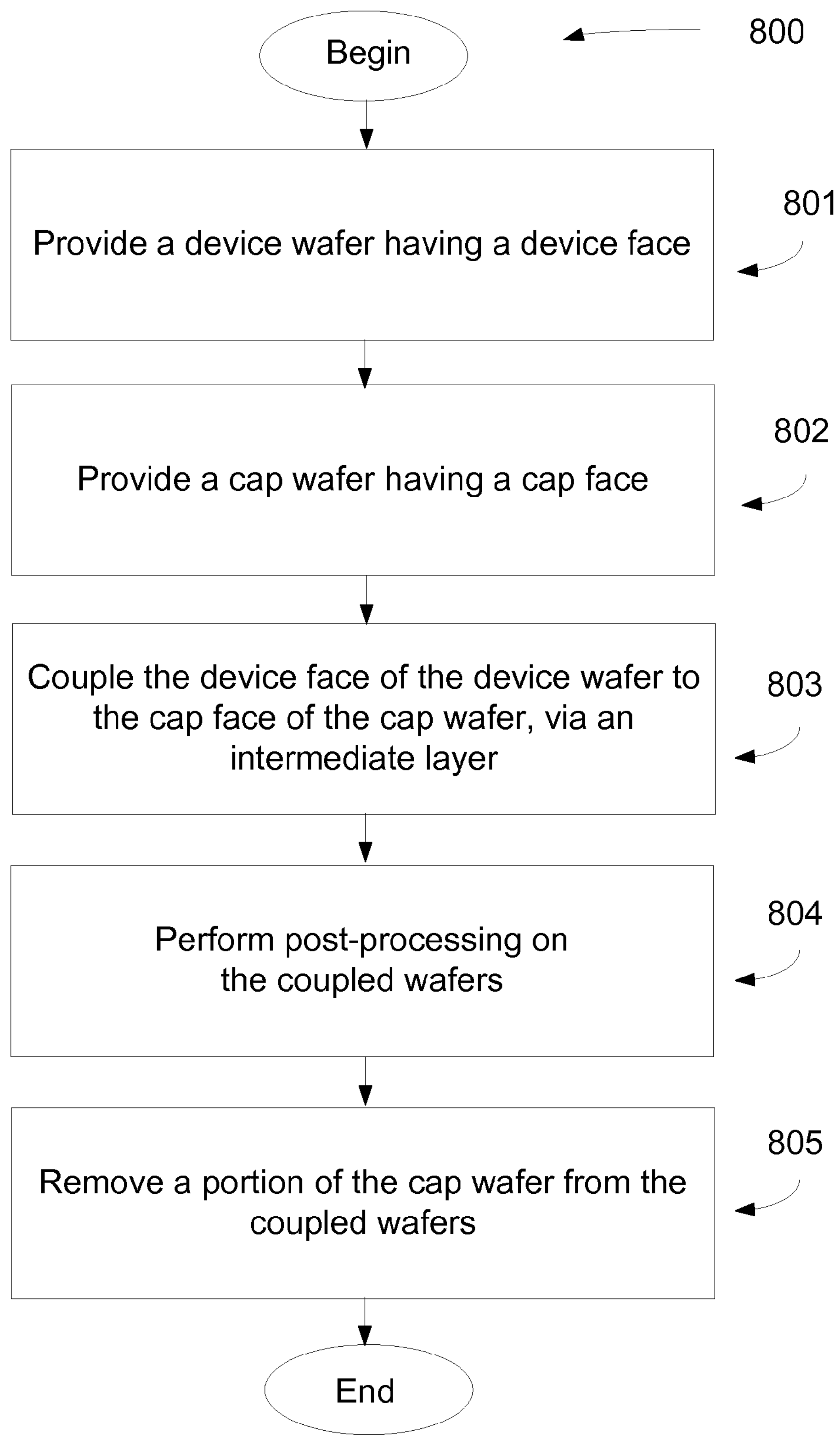
FIG. 8 is a flow chart illustrating a method of fabricating a capped wafer.

A flow chart illustrating a method of fabricating a capped wafer is presented in FIG. 8. A device wafer having a device face is provided (801) and a cap wafer having a cap face is provided (802). The device face of the device wafer, and the cap face of the cap wafer, are then coupled together with an intermediate layer (803) to form the capped wafer. In some embodiments, the intermediate layer seals the device wafer and the cap wafer together to define an interior volume between the device wafer and the cap wafer. Optionally, post-processing (804) (such as wafer thinning) may be performed on the sealed capped wafer. A seal formed by the intermediate layer between the device wafer and the cap wafer may protect the devices and caps within the sealed volume. Excess cap wafer material above the device wafer may then be removed.

Figure 9:
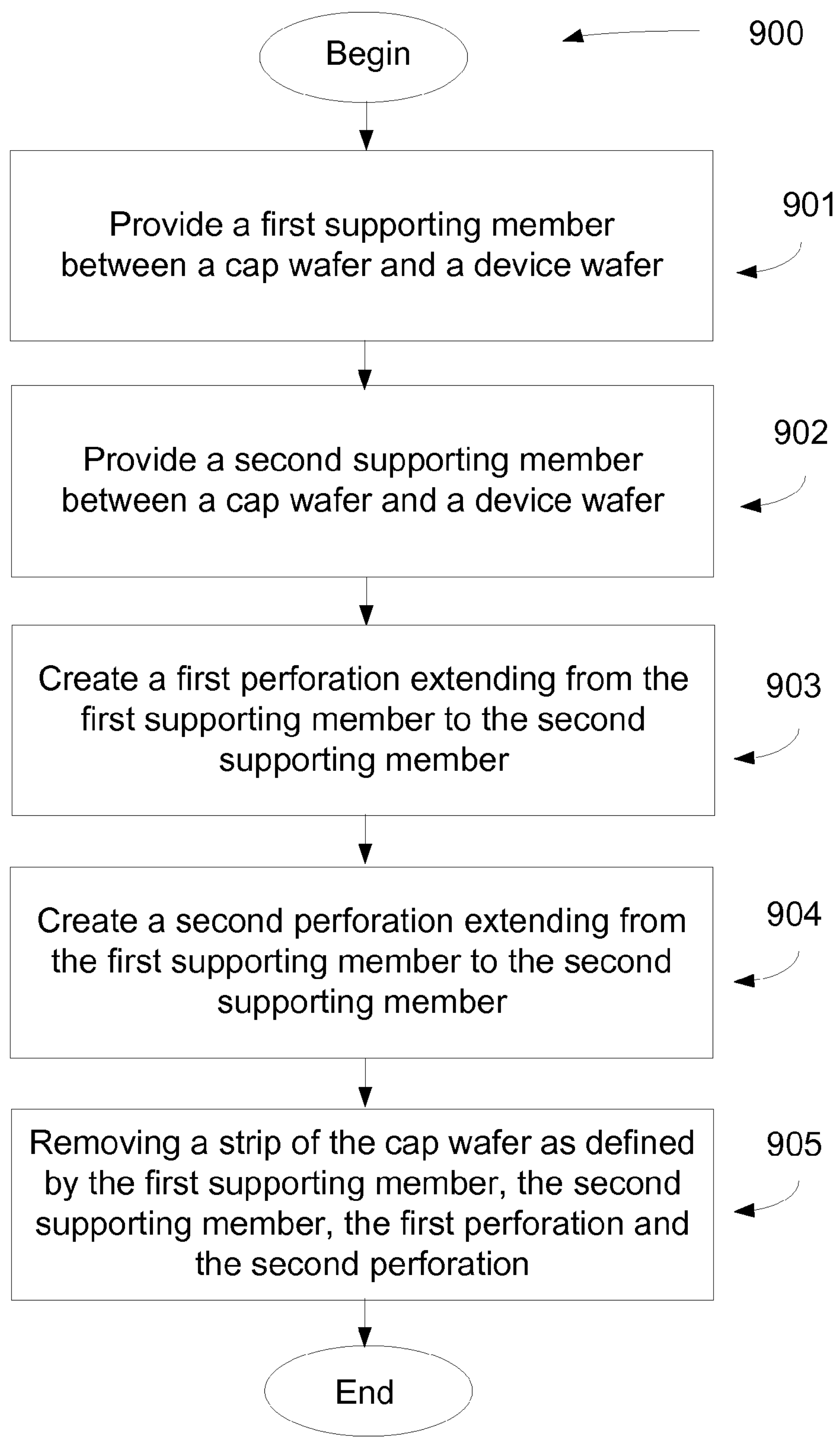
FIG. 9 is a flow chart illustrating a method of fabricating a capped wafer, including removal of excess cap wafer material.

A flow chart illustrating a method of fabricating a capped wafer, including removal of strips of excess cap wafer material, is presented in FIG. 9. A first supporting member is provided (901) between the device face of a device wafer and the cap face of a cap wafer. In some embodiments, the supporting member may be part of the cap wafer, part of a device wafer, or part of an intermediate layer between the cap wafer and the device wafer. Alternately, in some embodiments, the supporting member may be a combination of an intermediate layer with a part of the cap wafer or device wafer.

In some embodiments, the supporting member may be part of a wall around the device wafer and/or the cap wafer, and may include part of an intermediate layer between the device wafer and the cap wafer. In some embodiments, such a wall may be continuous, or may include discontinuities in places where a supporting member is not needed.

A second supporting member is provided (902) between a device wafer and a cap wafer. The second supporting member may be similar to the first supporting member, and in some embodiments may be part of the same wall structure between the device wafer and the cap wafer.

A first perforation (903) and a second perforation (904) are then created in the cap wafer, extending from the first supporting member to the second supporting member. In a preferred embodiment, the perforations are substantially parallel to each other in the plane of the cap wafer, and thereby define a strip of cap wafer supported on its distal ends by the first and second supporting members. The strip of cap wafer is then removed (905), for example by the application and removal of an adhesive tape. In some embodiments, removal of the strip of cap wafer exposes the device face of the underlying device wafer.

It should be noted that various of other means of removing a strip of cap wafer may be employed, such as mechanical removal, or removal by vacuum. Thus, the use of adhesive tape is illustrative only.

Figure 6C:
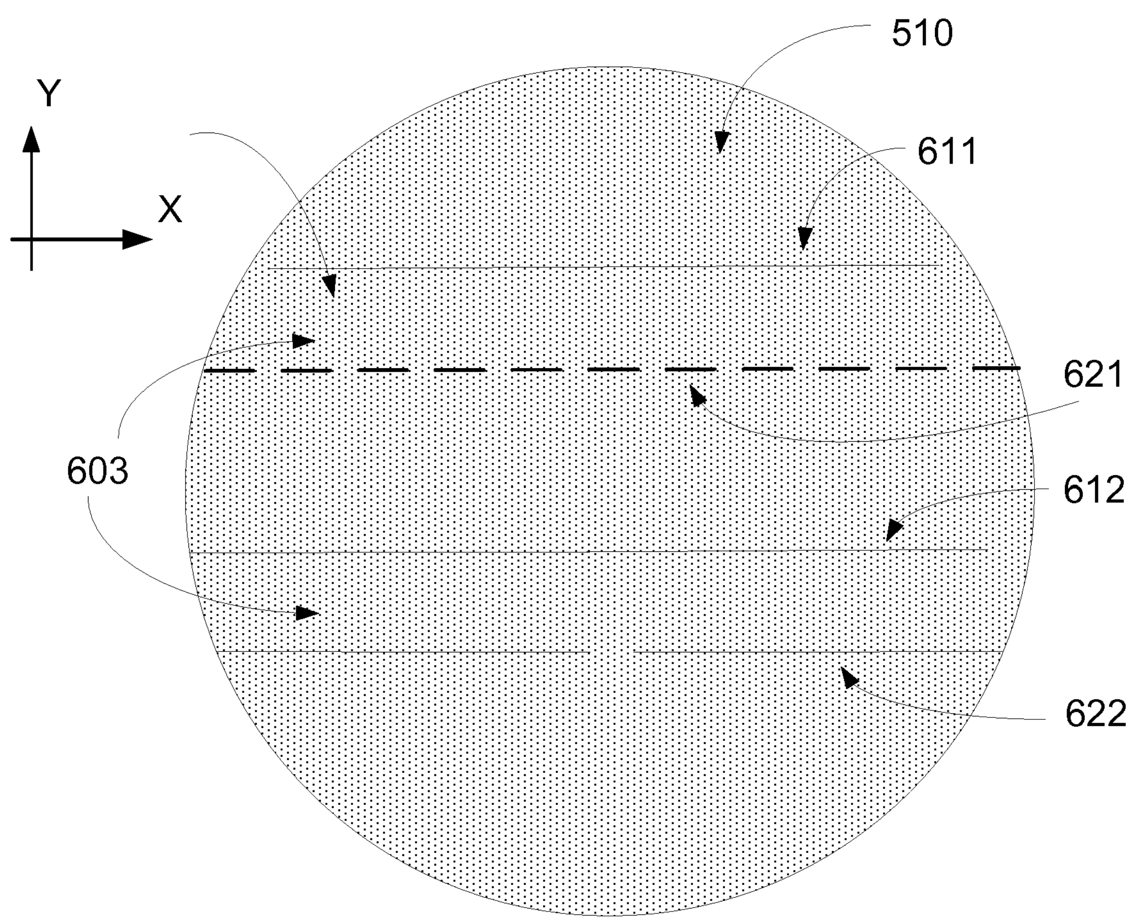
FIG. 6C schematically illustrates a capped wafer in which a variety of initial perforations have been made in the cap wafer.

It should also be noted that the perforations in the cap wafer 510 do not need to extend in a continuous perforation the entire distance from one edge of the cap wafer to the opposite edge of the cap wafer. For example, some alternative perforations are illustrated in FIG. 6C. In some embodiments, one or more perforations may extend from a first wafer edge to a point between the first edge and the opposite edge (as illustrated by perforation 612), or two cuts may begin at opposing edges and continue inward from the edges along a line toward a common center point, without connecting (as illustrated by perforation 622). In yet another embodiment, one or more such cuts may being at a point between the edges of the cap wafer 510, and extend along a line between two points on the edge of the cap wafer 510 without reaching those edge points (as illustrated by perforation 611). In yet another embodiment, the cuts may be formed by a series of perforations along a line (as illustrated by perforation 621).

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of fabricating a capped wafer, the method comprising:

providing a device wafer having a device face;

providing a cap wafer having a cap face;

coupling the device face to the cap face to form an intermediate apparatus, the intermediate apparatus also having at least one supporting member between the device face and the cap face;

creating a first perforation in the cap wafer;

creating a second perforation in the cap wafer, the first perforation being substantially parallel to the second perforation, the first perforation and the second perforation defining a strip of wafer cap supported by the at least one supporting member.

2. The method of fabricating a capped wafer of claim 1, wherein the first perforation extends substantially from the first supporting member to a second supporting member.

3. The method of fabricating a capped wafer of claim 1, wherein the first perforation extends substantially from the first supporting member to the second supporting member, and the second perforation extends substantially from the first supporting member to the second supporting member.

4. The method of fabricating a capped wafer of claim 1, wherein creating the first perforation comprises sawing through the cap wafer.

5. The method of fabricating a capped wafer of claim 4 wherein sawing through the wafer cap further comprises sawing through the at least one supporting member.

6. The method of fabricating a capped wafer of claim 4 wherein sawing through the wafer cap further comprises sawing through a first supporting member and a second supporting member.

7. The method of fabricating a capped wafer of claim 1, further comprising removing the strip of cap wafer.

8. The method of claim 7 wherein removing the strip of cap wafer further comprises severing the strip of wafer cap between a first supporting member and a second supporting member.

9. The method of claim 7 wherein removing the strip of cap wafer further comprises lifting the strip of wafer cap with adhesive tape.

* * * * *